(12) United States Patent
Xiao et al.

(10) Patent No.: US 9,304,179 B1
(45) Date of Patent: Apr. 5, 2016

(54) METHOD OF MAGNETIC RESONANCE IMAGING COMBINING PHASE AND FREQUENCY ENCODING

(75) Inventors: Dan Xiao, Fredericton (CA); Bruce Balcom, Fredericton (CA)

(73) Assignee: University of New Brunswick, Fredericton, New Brunswick (CA)

( * ) Notice: Subject to any disclaimer, the term of this patent is extended or adjusted under 35 U.S.C. 154(b) by 891 days.

(21) Appl. No.: 13/571,691

(22) Filed: Aug. 10, 2012

Related U.S. Application Data

(60) Provisional application No. 61/522,963, filed on Aug. 12, 2011.

(51) Int. Cl.
  *G01R 33/54* (2006.01)
(52) U.S. Cl.
  CPC ................................ *G01R 33/546* (2013.01)
(58) Field of Classification Search
  CPC ........................................................ G01R 33/546
  See application file for complete search history.

(56) References Cited

U.S. PATENT DOCUMENTS

| | | | |
|---|---|---|---|
| 4,717,878 A | 1/1988 | Taicher et al. | |
| 5,212,447 A | 5/1993 | Paltiel et al. | |
| 5,309,098 A | 5/1994 | Coates et al. | |
| 5,363,041 A | 11/1994 | Sezgner | |
| 5,510,710 A | 4/1996 | Nauerth | |
| 5,545,991 A | 8/1996 | Nauerth | |
| 5,557,200 A | 9/1996 | Coates | |
| 5,695,448 A | 12/1997 | Kimura et al. | |
| 6,341,179 B1 * | 1/2002 | Stoyle et al. | 382/254 |
| 6,512,371 B2 | 1/2003 | Prammer | |
| 6,856,132 B2 * | 2/2005 | Appel et al. | 324/303 |
| 6,954,066 B2 | 10/2005 | Siess et al. | |
| 7,541,806 B2 | 6/2009 | Appelt et al. | |
| 7,872,474 B2 | 1/2011 | Pusiol et al. | |
| 8,004,279 B2 | 8/2011 | Kruspe et al. | |
| 8,022,698 B2 | 9/2011 | Rottengatter et al. | |
| 8,717,022 B2 * | 5/2014 | Han et al. | 324/309 |
| 8,791,695 B2 * | 7/2014 | Balcom et al. | 324/307 |
| 8,890,524 B2 * | 11/2014 | Boernert et al. | 324/309 |
| 9,018,950 B2 * | 4/2015 | Li et al. | 324/309 |

FOREIGN PATENT DOCUMENTS

| | | |
|---|---|---|
| CA | 1065248 | 10/1979 |
| CA | 2646456 A1 | 4/2008 |
| EP | 1655617 A2 | 5/2006 |
| WO | 2010003236 A1 | 1/2010 |

OTHER PUBLICATIONS

John Jackson, et al., Low-Frequency Restoration, Magn. Reson. Med. 11(2): 248-257, Aug. 1989.
Sylvia K. Plevritis, Albert Macovski, Spectral Extrapolation of Spatially Bounded Images, IEEE Trans Med Imaging 14(3): 487-497 (1995).
Dean O. Kuethe, et al., Transforming NMR Data Despite Missing Points, J. Magn. Reson. 139(1): 18-25, Jul. 1999.

(Continued)

*Primary Examiner* — Dixomara Vargas
(74) *Attorney, Agent, or Firm* — Eugene F. Derenyi; Fogler, Rubinoff LLP

(57) ABSTRACT

An MRI sampling method combining phase and frequency encoding.

13 Claims, 15 Drawing Sheets

(56) References Cited

OTHER PUBLICATIONS

Yaotang Wu, Water- and Fat-Suppressed Proton Projection MRI (WASPI) of Rat Femur Bone, Magn. Reson. Imaging 57(3): 554-567, Mar. 2007.
Jurgen Rahmer, Three-Dimensional Radial Ultrashort Echo-Time Imaging with T2 Adapted Sampling, Magn. Reson. Med. 55(5): 1075-1082, May 2006.
Fabian Springer, Effects of In-Pulse Transverse Relaxation in 3D Ultrashort Echo Time Sequences: Analytical Derivation Comparison to Numerical Simulation and Experimental Application at 3 T, J. Magn. Reson. 206(1): 88-96, Sep. 2010.
Jiang Du, Short T2 Contrast with Three-Dimensional Ultrashort Echo Time Imaging, Magn. Reson. Imaging 29(4): 470-482, May 2011.
Djaudat Idiyatullin, et al., Fast and Quiet MRI Using a Swept Radiofrequency, J. Magn. Reson. 181(2): 342-349, Aug. 2008.
Djaudat Idiyatullin, et al. Gapped Pulses for Frequency-Swept MRI, J. Magn. Reson. 193(2): 267-273, Aug. 2008.
B. J. Balcom, et al., Single-Point Ramped Imaging with T1 Enhancement (SPRITE), J. Magn. Reson. 123(1): 131-134, Nov. 1996.
Zang H. Cho, Yong M. Ro, Multipoint k-Space Point Mapping (KPM) Technique for NMR Microscopy, Magn. Reson. Med. 32(2): 258-262, Aug. 1994.
M. A. Fernandez-Sara, et al., Multipoint Mapping for Imaging of Semi-Solid Materials, J. Magn. Reson. 160(2): 144-150, Feb. 2003.
David M. Grodzki, et al., Ultrashort Echo Time Imaging Using Pointwise Encoding Time Reduction with Radial Acquisition (PETRA), Magn. Reson. Med. 67(2): 510-518, Feb. 2012.
Igor V. Mastikhin, et al., SPRITE MRI with Prepared Magnetization and Centric k-Space Sampling, J. Magn. Reson. 136(2): 159-168, Feb. 1999.
Meghan Halse, et al., Centric Scan SPRITE Magnetic Resonance Imaging, J. Magn. Reson. 165(2): 219-229, Dec. 2003.
J. Schoukens, J. Renneboog, Modeling the Noise Influence on the Fourier Coefficients After a Discrete Fourier Transform, IEEE Trans Intru. Measure. 35(3): 278-286, Sep. 1986.
John I. Jackson, et al., Selection of a Convolution Function for Fourier Inversion Using Gridding, IEEE Trans. Med. Imaging 10(3): 473-478 (1991).
Kenneth O. Johnson, James G. Pipe, Convolution Kernel Design and Efficient Algorithm for Sampling Density Correction, Magn. Reson. Med. 61(2): 439-447, Feb. 2009.
Wayne Lawton, A New Polar Fourier Transform for Computer-Aided Tomography and Spotlight Synthetic Aperture Radar, IEEE Trans. Acous. Speech. Signal Proc. 36(6): 931-935, Jun. 1988.
Hui Han, et al., Pure Phase Encode Magnetic Field Gradient Monitor, J. Magn. Reson. 201(2): 212-217, Dec. 2009.
I. V. Mastikhin, Water Content Profiles with a 1D Centric SPRITE Acquisition, J. Magn. Reson. 156(1): 122-130, May 2002.
D. Xiao, B. Balcom, Hybrid-SPRITE MRI, In proceedings of the 11th International Conference on Magnetic Resonance Microscopy Joint Topic Conference on NMR in Well Logging and Core Analysis, Beijing, China, 2011, p. 47.
Joachim B. Kaffanke, A method for resolution enhancement of multiple-point SPRITE data, J. Magn. Reson. 230 (2013) 111-116.

* cited by examiner

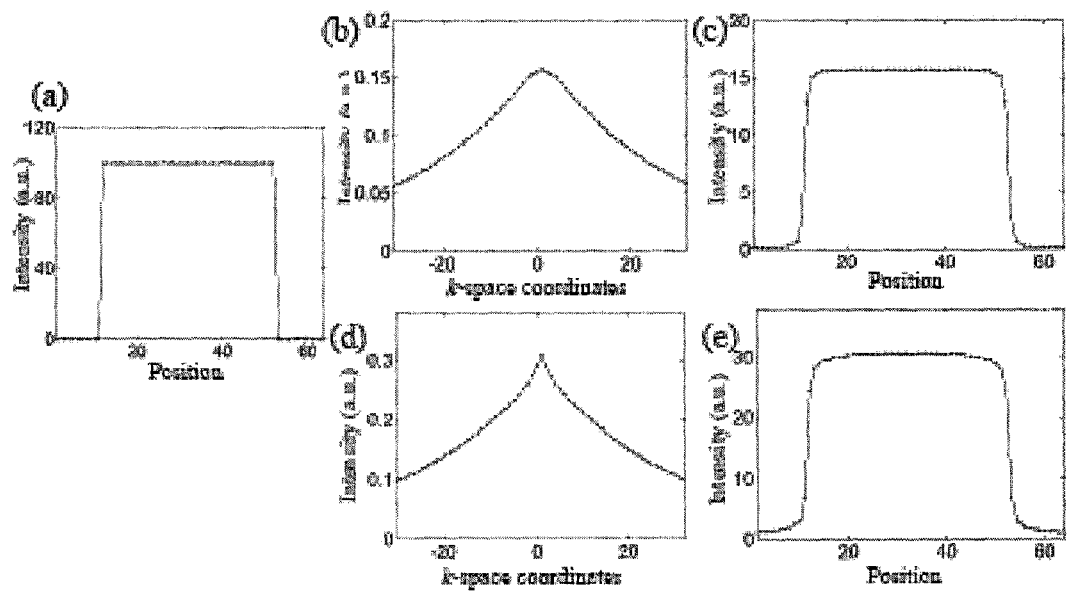
FIGS 3(a)-(e)
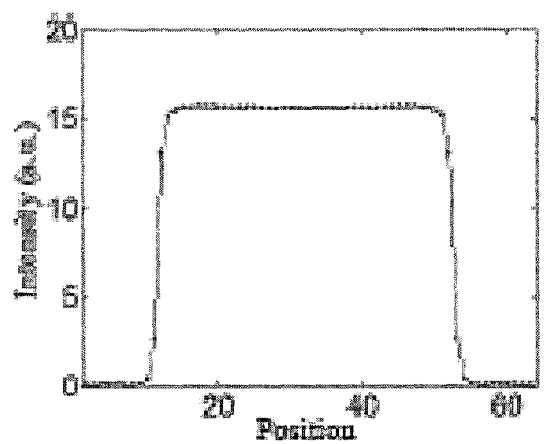
FIG. 4

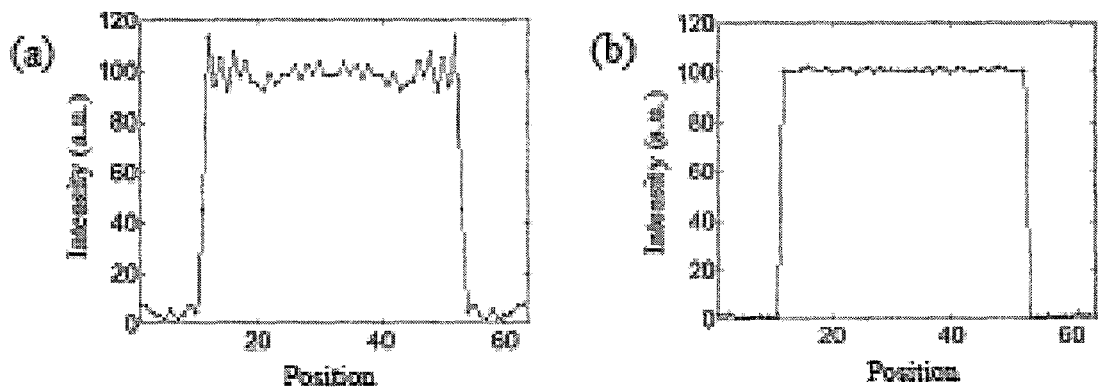
FIGS 5(a) and (b)
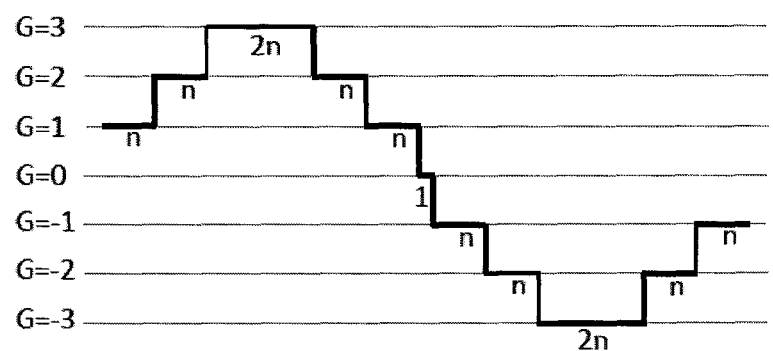
FIG. 6

FIGS 13(a) and (b)

FIGS 14(a) and (b)

METHOD OF MAGNETIC RESONANCE IMAGING COMBINING PHASE AND FREQUENCY ENCODING

CROSS-REFERENCE TO RELATED APPLICATIONS

This application claims the benefit of U.S. Provisional Application No. 61/522,963 filed Aug. 12, 2011.

FIELD

The present invention relates to magnetic resonance imaging.

BACKGROUND

In a free induction decay ("FID") based frequency encoding magnetic resonance imaging ("MRI") experiment, the central part of k-space is generally not accessible due to the probe dead time, which is crucial for image reconstruction. Single point imaging ("SPI") gives good quality images as a pure phase encoding technique. Single point ramped imaging with $T_1$ enhancement ("SPRITE") is known in the art [10]. SPI with a linearly ramped phase encoded gradient, has been used for short relaxation time systems for many years. As it requires high magnetic field gradient strengths, short encoding times, and low flip angle radio frequency ("RF") pulses to cover the sample bandwidth, the sensitivity (signal-to-noise ratio ("SNR") over square root of acquisition time) is suboptimal, especially for low field systems.

SUMMARY OF THE DISCLOSURE

In one implementation, the present disclosure is directed to a magnetic resonance method for imaging an object including generating an MRI sampling sequence comprising a pure phase encoding and a frequency encoding, and reconstructing an image of the object from the signal generated by the sequence.

Certain implementations of the invention include an MRI sampling scheme combining phase and frequency encoding. The invention is also generally referred to by the inventors as hybrid-SPRITE and an MRI sampling sequence according to the invention is generally referred to by the inventors as a hybrid-SPRITE sequence.

In certain implementations of hybrid-SPRITE, numerous time domain points are collected to assist image reconstruction. Discrete Fourier Transform is employed in a 1D application according to an embodiment of the present invention. Pseudo-polar grid is exploited in a 2D hybrid-SPRITE method according to an embodiment of the present invention for rapid and accurate image reconstruction.

Certain implementations of the invention include acquiring k-space origin data by pure phase encoding and filling in the k-space periphery by frequency encoding. There are intermediate k-space points which may be acquired through both phase encoding and frequency encoding methods.

In certain implementations of the invention, gradients are ramped in the same fashion as in the SPRITE method for the first few phase encoding steps, with time domain data collected for the latter k-space steps as in FID based frequency encoding. The number of phase encoding steps depends on the sample $T_{2*}$. The shorter the $T_{2*}$, the more phase encoding steps should be acquired to control $T_{2*}$ blurring. 3 to 5 phase encoding steps on each side of the origin is generally a good choice in a 64 point profile.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIGS. 3(a)-(e) show simulation results from a simulation of $T_1$ and $T_{2*}$ effects according to one or more embodiments of the present invention;

FIG. 4 shows a profile of a model sample simulation according to an embodiment of the present invention;

FIGS. 5(a) and (b) show profiles simulated according to embodiments of the invention;

FIG. 6 shows a 1D gradient waveform modified according to an embodiment of the present invention;

DETAILED DESCRIPTION

1D Hybrid-SPRITE Sequence

Figure 1:
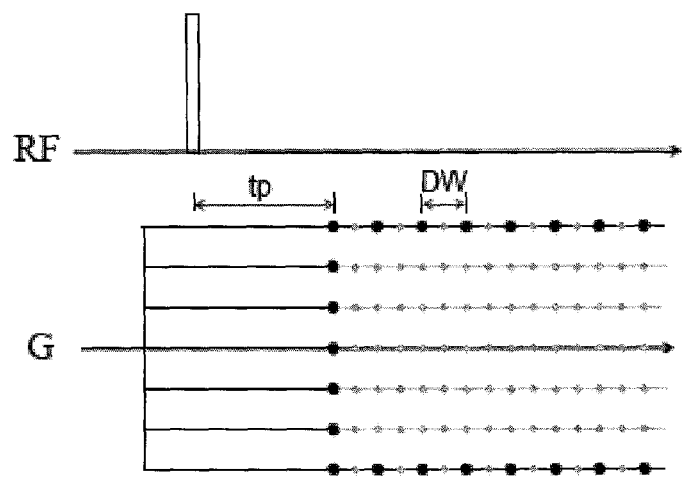
FIG. 1 shows a one dimensional ("1D") MRI pulse sequence according to an embodiment of the invention.

A one dimensional ("1D") MRI pulse sequence (also referred to by the inventors as a 1D Hybrid-SPRITE Sequence) according to one embodiment of the invention is depicted in FIG. 1. The dark black dots are the required k-space data. The lighter grey dots are free by-products that can be used in different ways to assist image reconstruction. tp is limited by the probe dead time.

In 1D MRI, the k-space coordinate is defined as Eq.1:

$$k = \gamma \int G \cdot t dt.$$ Eq. [1]

For the first few k-space points, gradients of different amplitudes are applied, while the encoding times are kept constant as in the SPRITE sequence [16, 17]. Gradients are ramped in the same fashion as in SPRITE. Time domain data are collected for the latter k-space steps as in RD based frequency encoding.

Centric Scan Hybrid-SPRITE

Figure 2:
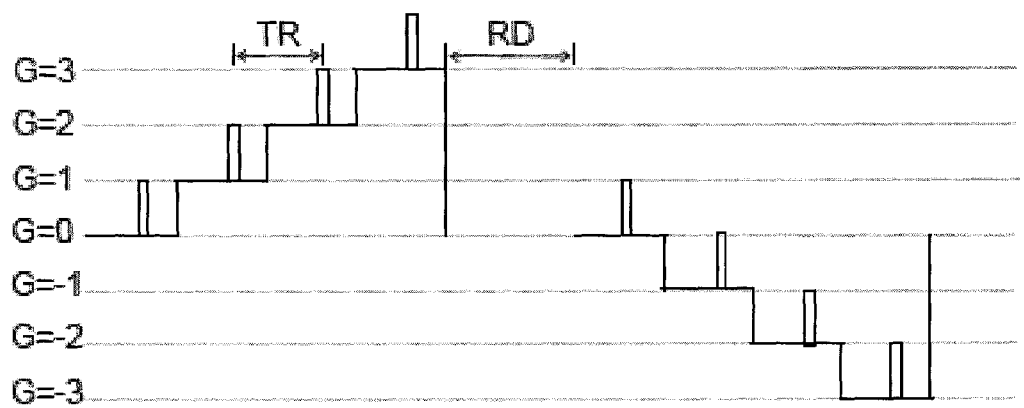
FIG. 2 shows an MRI sampling scheme combining phase and frequency encoding according to an embodiment of the invention.

In certain embodiments, an application of a 1D Hybrid-SPRITE Sequence is the centric scan double half k-space ("DHK") type of gradient waveform with long relaxation delay RD. Referring to FIG. 2, in an embodiment of the invention, an MRI sampling scheme combining phase and frequency encoding is applied to a centric scan double half k-space type of gradient waveform with long relaxation delay RD. Larger flip angle radio frequency ("RF") pulses are possible due to reduced bandwidth and can be employed to increase SNR, although it produces more $T_1$ blurring.

Figure 9:
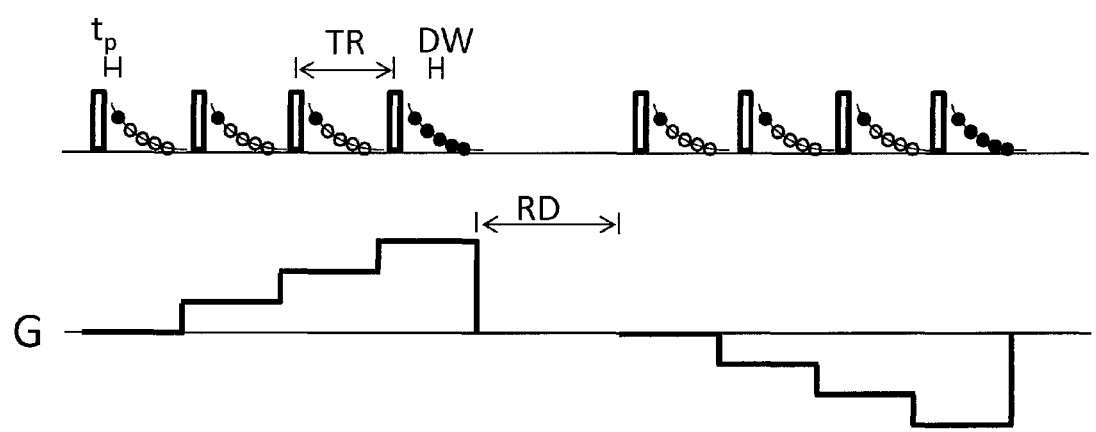
FIG. 9 shows a 1D centric scan Hybrid-SPRITE pulse sequence according to an embodiment of the present invention. The solid dots are the required k-space data, while DW is the interval between them in the FID. The circles are extra points that can be used in different ways to assist image reconstruction.

A centric scan hybrid-SPRITE pulse sequence according to another embodiment of the present invention is shown in FIG. 9. The solid dots are the required k-space data. The circles are extra points that can be used in different ways to assist image reconstruction. $t_p$ is limited by the probe dead time. The sample bandwidth is much reduced since only the lowest few gradient steps are required, so that larger flip angle RF pulses are possible and can be employed to increase SNR. The drawback is that it produces more $T_1$ related blurring.

In the centric scan hybrid-SPRITE scheme according to an embodiment of the present invention, the signals are attenuated due to both $T_1$ and $T_2^*$. The first few pure phase encode points have the same $T_2^*$ attenuation since they are of the same $t_p$, but increasing $T_1$ effect as the longitudinal magnetization is reduced after each RF pulse. The frequency encode points have an increasing $T_2^*$ attenuation in addition to the same $T_1$ saturation. This results in an attenuation mask in k-space that yields a blurring in the image domain. This mask relates to the sample $T_1$ and $T_2^*$ as well as imaging parameters.

In a study by the inventors, proton density images were pursued, so the centric scan scheme is preferable to achieve images free of $T_1$ contrast. In DHK SPRITE, a long relaxation delay at the end of each half k-space is required for both magnetization relaxation and gradient cooling. In the hybrid-SPRITE method according to one or more embodiments of the present invention, only a few RF pulses and low amplitude gradients are employed, therefore the long relaxation delay is not necessary. Preferably, the delay time is divided and equally spaced between RF pulses when there are only a few excitations. The long delays between each excitation ensure the acquisitions are free of $T_1$ influence, so that the k-space trajectory does not need to commence at the origin, as in the centric scan cases, for density imaging. This leads to the idea of differential sampling in other respects, such as increased signal averaging of some portions of k-space.

Advanced Hybrid-SPRITE

The SNR of the k-space origin can be improved by averaging numerous FID points for the k=0 step so it can be assigned a lower weight in the acquisition. Image quality can be improved by signal averaging more of the k≠0 points. This works well when a long delay between each RF pulse is provided. The gradient waveform can be modified as depicted in FIG. 6 (the value under each step in FIG. 6 is times to repeat i.e the number of repetitions).

Discrete Fourier Transform

The choices of data acquisition rates are limited due to hardware restrictions. It is challenging to set the acquisition rate to the exact dwell time required for k-space grid. In a simulation conducted according to certain embodiments of the invention, the sampling rate was set to 1 µs, much less than the required dwell time. Numerous "redundant" points in k-space were sampled. They can be used in various ways to improve image reconstruction. In one embodiment, a Discrete Fourier Transform ("DFT") is used including as many k-space points as possible to improve SNR. The SNR of the image after DFT is proportional to $\sqrt{N}$ [18], where N is the number of sample points employed. The DFT was found by the inventors to execute rapidly on a conventional computer. For example, a 1D Hydrid-SPRITE simulation took less than 0.1 sec to process on the computer used.

FIGS. 5(a) and (b) are graphical representations of profiles simulated according to embodiments of the invention. FIG. 5(a) is a profile reconstructed with Fast Fourier Transform ("FFT") and FIG. 5(b) is a profile reconstructed using DFT with 1109 points. FIG. 5(b) shows an SNR improved by a factor of 7 as compared to FIG. 5(a). In these simulations, $T_1$ and $T_{2*}$ effects were not taken into account.

2D and Higher Dimensional Hybrid-SPRITE

Figure 8:
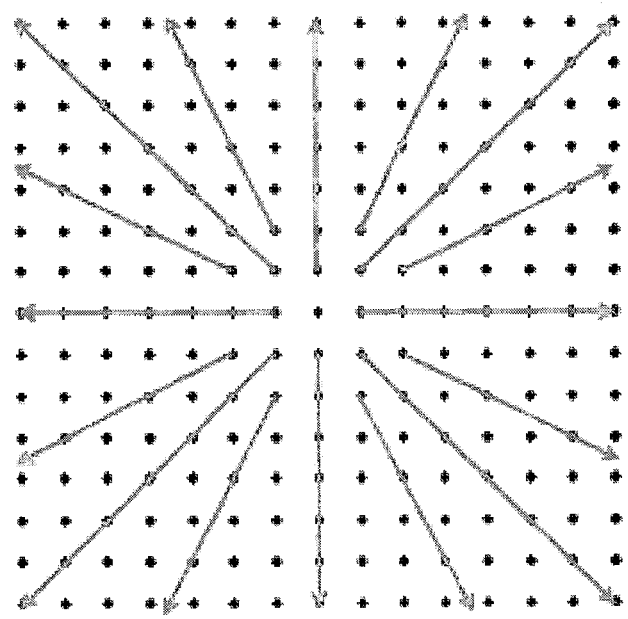
FIG. 8 shows a k-space pattern generated using a 2D Hybrid SPRITE method according to an embodiment of the present invention.

In certain other embodiments of the invention, the Hybrid-SPRITE method can be extended to higher dimensions such as two dimensions ("2D"). Extension to two dimensions is referred to by the inventors as 2D Hybrid-SPRITE. The k-space trajectories are more versatile for 2D combining MFGM measurements. MFGM measurements are known in the art [22]. FIG. 8 shows a k-space pattern generated using a 2D Hybrid SPRITE method according to an embodiment of the present invention.

A radial trajectory, in the time domain, is the simplest as it does not require monitoring dynamic gradient waveforms. The simple point-to-point DFT is not realistic in this case, since it can take hours to process when k-space is largely oversampled. The most popular processing method, gridding, is to resample data on a Cartesian grid for rapid image reconstruction [19]. In gridding, convolution kernel design and sampling density correction can cause reconstruction error [20]. In one or more embodiments of the present invention, the pseudo-polar grid radial sampling scheme is employed that allows rapid Discrete Fourier reconstruction.

Figure 10:
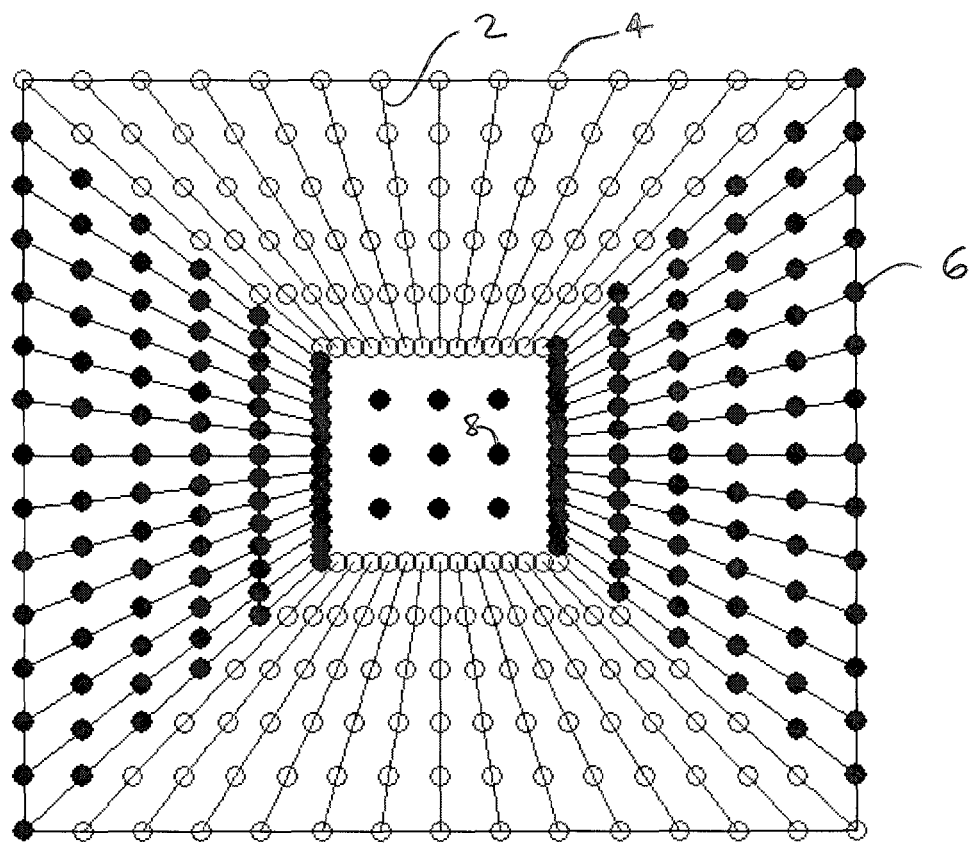
FIG. 10 shows a Pseudo-polar grid employed in 2D hybrid-SPRITE.

The pseudo-polar grid, also known as a concentric squares grid, shown in FIG. 10. It consists of rays equally spaced instead of equally angled. Sixty-three rays 2 on each quarter are required for a 63×63 image to meet the Nyquist criterion. Exact reconstruction with no interpolations or any accuracy parameters can be performed. The reconstruction is rapid as it requires only 1D FFT operations. The data can be separated into pure horizontal, pure vertical and the central pure phase encoding parts. The three parts are processed independently, and then combined. For the pure horizontal parts marked by circles 4 in FIG. 10, data points on each horizontal line are equally spaced. The circles 4 constitute the pure horizontal part, and the dots 6 are pure vertical. The dots 8 in the center are on a Cartesian grid. The three parts are processed individually and added together in image domain. The FFT was first performed on the horizontal direction after zero padding to the grid length. After each line is processed, 1D Fourier transforms are applied on the other dimension, namely vertical, direction. Since the intervals between lines are constant, with proper number of zero lines in the center standing for the low frequency pure phase encoding part, an FFT can be employed. The pure vertical part is processed similarly. The central part is transformed by a simple 2D FFT, as the points are on Cartesian grid.

Figure 11:
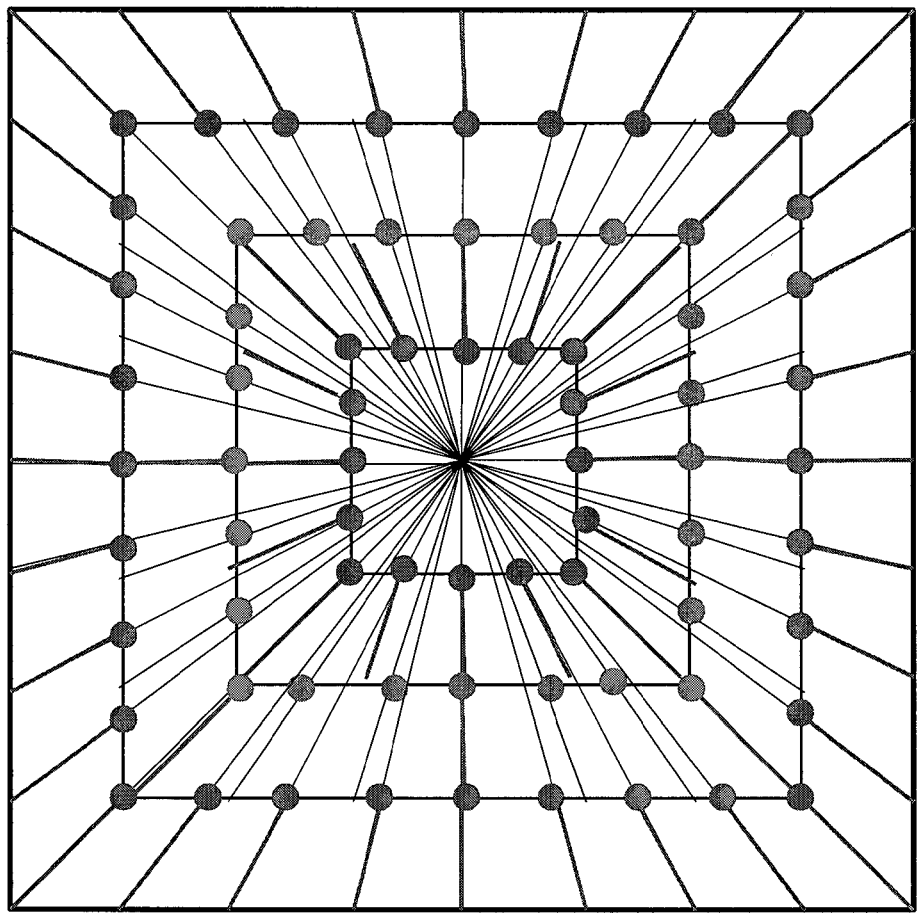
FIG. 11 shows a Pseudo-polar grid of the pure phase encoding portion of k-space according to an embodiment of the present invention.

With a slight modification of the gradient strength, the central part can become pseudo-polar grids of different sizes that satisfy the Nyquist criterion so that a similar processing routine can be employed including the time domain data points. The example with 4 steps of pure phase encoding is shown in FIG. 11.

Simulations

The following is a discussion of simulations conducted according to certain embodiments of the invention.

Simulation of $T_1$ and $T_{2*}$ Effects

FIGS. 3(a)-(e) are graphical representations of simulation results from a simulation of $T_1$ and $T_{2*}$ effects. FIG. 3(a) represents a model sample profile with $T_1$=100 ms, $T_{2*}$=500 μs, FIG. 3(b) represents k-space attenuation function of a 10° flip angle pulse, FIG. 3(c) represents a simulation profile of 10° flip angle, FIG. 3(d) represents k-space attenuation function of a 20° flip angle pulse, and FIG. 3(e) represents a profile of a 20° flip angle pulse. Parameters used in the simulation are TR=2 ms, tp=51 μs, DW=17 μs.

The differences of early k points are due to $T_1$ since they are of the same tp, while the differences of later k points are from $T_{2*}$, as shown in FIG. 2. A larger flip angle increases signal intensity that is favorable for SNR but causes more severe blurring.

$T_1$ Effect Elimination

The 5 times $T_1$ delay at the end of each half k-space is not required for gradient cooling in Hybrid-SPRITE since only low amplitude gradients are employed. This relaxation delay can be divided and equally spaced between RF pulses. For a 1.25× $T_1$ delay following each 10° RF pulse, the magnetization recovers to approximately 99.4% after numerous pulses. $T_1$ effects are considered by the inventors to be negligible, so that gradient can commence at any point of k-space. The inventors have found that Hybrid-SPRITE according to one or more embodiments of the invention yields improved results with reduced acquisition time as compared with conventional SPRITE.

FIG. 4 is a graphical representation of a profile of a model sample simulation using the same parameters as used for the model sample represented in FIGS. 3(a)-(e), except that TR=125 ms following 10° flip angle pulses.

In 1D hybrid-SPRITE, the number of phase encode steps depends on the sample $T_2^*$. The shorter the $T_2^*$, the more phase encode steps should be acquired to control $T_2^*$ blurring. 3 to 10 phase encode steps on each side of the origin is generally a good choice in a 64 point profile.

$T_1$ and $T_2^*$ effects in hybrid-SPRITE on an ideal boxcar sample are shown in FIGS. 12(a)-(c). $T_1$ and $T_2^*$ are 200 ms and 900 μs, as in all the simulations in this application, to match the relaxation times of real rock sample. FIG. 12(b) shows the attenuation mask in k-space of 10° RF pulses in centric scan hybrid-SPRITE. 10 phase encode steps were employed on each side of k-space excluding k=0. FIG. 12(c) shows the reconstructed profile. Larger flip angles increase signal intensity. This is favorable for SNR but causes more severe blurring due to $T_1$ saturation (not shown). The 10° pulse yields a profile of high quality shape, as indicated in FIG. 12(c).

Figure 12:
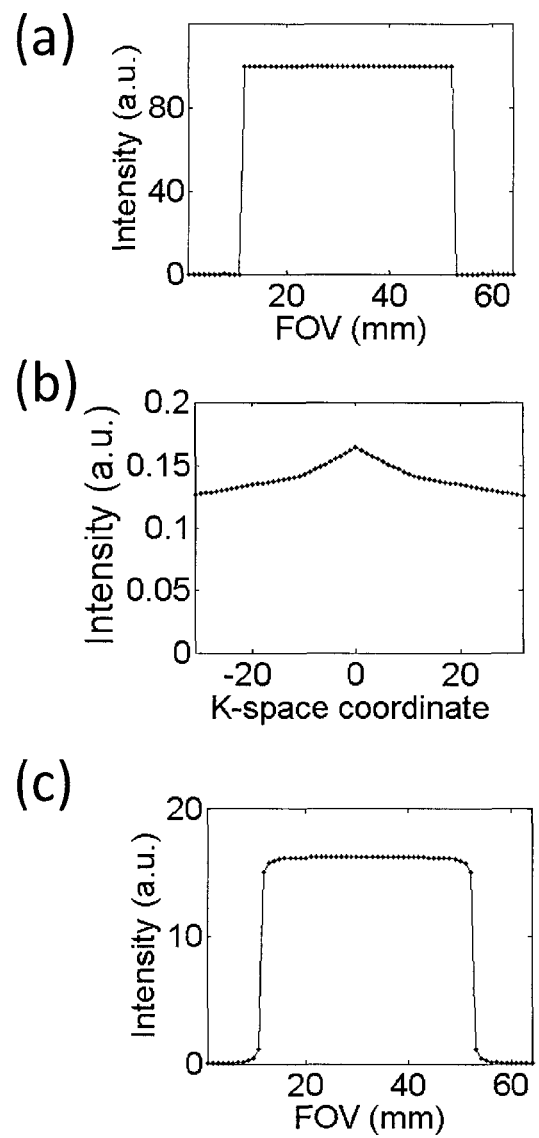
FIGS. 12(a)-(c) show simulations of $T_1$ and $T_2$* effects in a 1D hybrid-SPRITE method according to an embodiment of the present invention.
Figure 13:
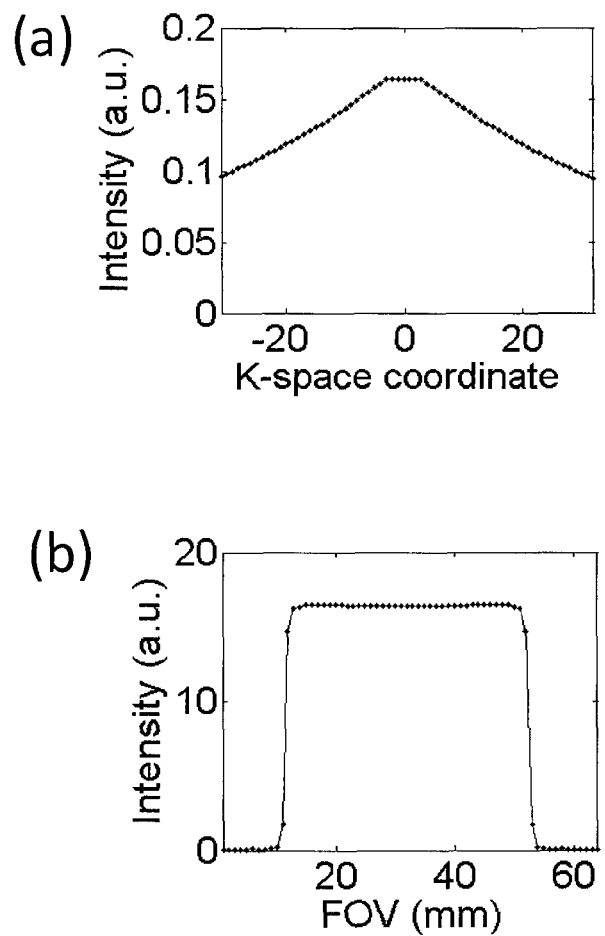
FIGS. 13(a) and (b) show simulation of $T_2$* effects according to a 1D hybrid-SPRITE method according to an embodiment of the present invention with a long TR scheme of the same model sample as in FIG. 5.

For a 1.25×$T_1$ delay following each 10° RF pulse, the magnetization recovers to 99.4% after numerous pulses. The magnetization recovery is more than the standard 5×$T_1$ delay after a 90° RF pulse, so that the $T_1$ effects are negligible. FIG. 13 is the result of the long TR scheme. FIG. 13(a) shows k-space attenuation of 10° RF pulses combining TR of 1.25× $T_1$, and FIG. 13(b) shows the corresponding profile. 3 phase encode steps on each side was considered. TR=1.25×$T_1$=250 ms combining a 10° flip angle yields negligible $T_1$ attenuation. Only 3 phase encode steps on each side of k-space were employed since each step increases the measurement time significantly. $T_2^*$ attenuation on the periphery of k-space points is more severe than the case in FIG. 12. FIG. 12(a) shows a model sample profile with $T_1$=200 ms, $T_2^*$=900 μs, as in all the following simulations. FIG. 12(b) shows k-space attenuation function of 10° flip angle pulses, with TR=4 ms, tp=50 μs, DW=5 μs, with 10 phase encode steps on each side, FIG. 12(c) simulated profile. However, the quality of the reconstructed image is not degraded, due to the flat top in the center of k-space in the attenuation mask of FIG. 12(b). The flat top ensures the validity of different k-space sampling schemes.

Figure 14:
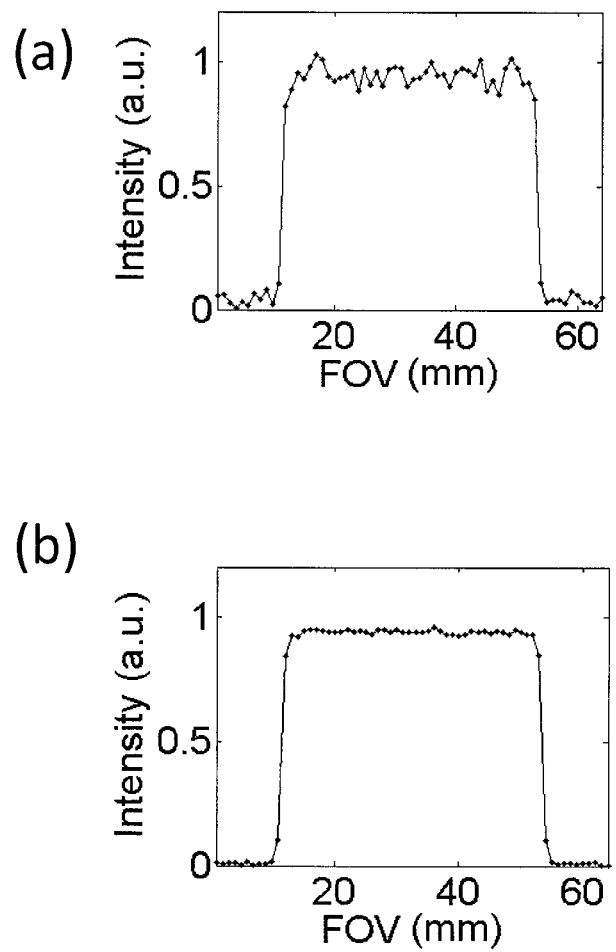
FIGS. 14(a) and (b) show simulations of profiles reconstructed.

FIG. 14 shows simulations of profiles reconstructed with FFT with 64 k-space points, and employing DFT with 1142 points. FIG. 14(a) shows a profile reconstruction with FFT and FIG. 14(b) shows a profile reconstruction employing DFT with 1142 points. SNR improves by a factor of 4.3 in this example. $T_2^*$ was set to 900 μs; The SNR improves significantly. The standard deviation of noise is reduced by a factor of 4.3 in this example. The result agrees with the theoretical value $\sqrt{1142/64} \approx 4.2$. The simulation had $T_2^*$ of 900 μs to match the real sample. The $T_1$ effect was neglected since a long TR was assumed. The other parameters are set to be the same as in the experiment discussed below.

Figure 15:
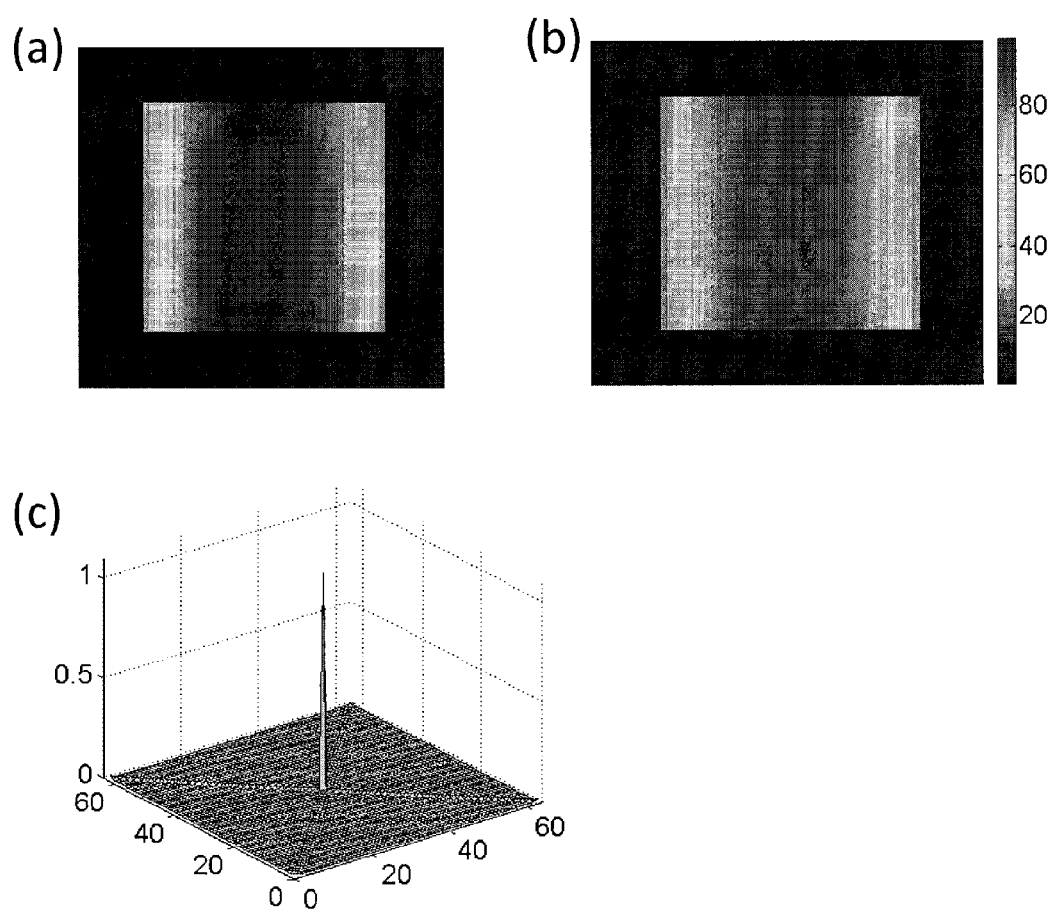
FIGS. 15(a)-(c) show simulations of 2D hybrid-SPRITE on a cylindrical sample combining the pseudo-polar sampling scheme with 8 interleaves.

Referring to FIGS. 15(a)-(c), time domain points were collected from $k_x=\pm 3$ and $k_y=\pm 3$. FIG. 15(a) is of a model sample with $T_1$=200 ms and $T_2^*$=900 μs. FIG. 15(b) is the result image, and FIG. 15(c) is the corresponding point spread function. TR was 4 ms. The encoding time for phase encode points was 51 μs, while the dwell time for time domain data was 17 μs;

In 2D hybrid-SPRITE, data are divided into 8 interleaves due to hardware restrictions. Each interleaf occupies a sector of π/4 angle. The points within each interleaf are arranged in the order of increasing distance from the k-space origin. The point spread function due to $T_1$ and $T_2^*$ attenuation is shown in FIG. 15 (c). A 7×7 phase encode matrix in the center of k-space was considered combining a 63x63 pseudo-polar coordinate. The simulated dwell time of time domain points was 17 μs, and the phase encoding time was 51 μs. TR can be longer than usually employed in Spiral SPRITE since the gradient duty cycle is significantly reduced. TR was set to 4 ms, the same as in the experiment discussed below. The result in FIG. 15 (b) closely resembles the model (a) with acceptable blurring.

Experimental Results

Figure 7:
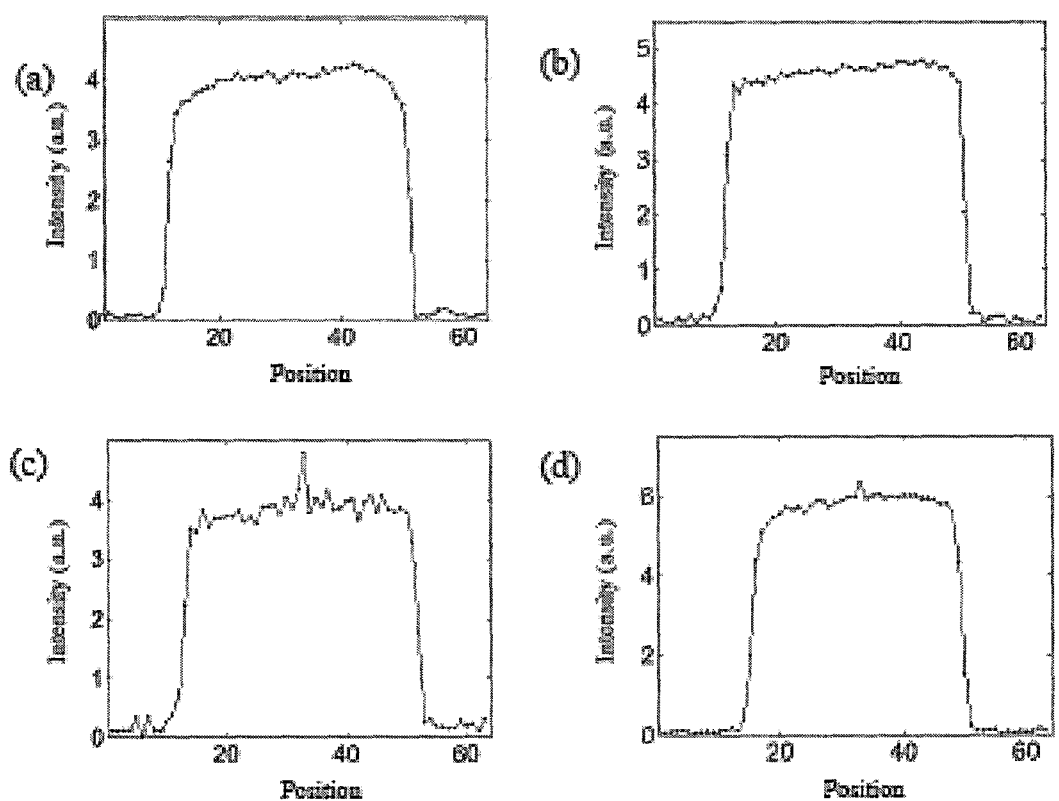
FIGS. 7(a)-(d) show profiles generated from experiments carried out using one or more methods according to embodiments of the present invention.

Experiments using certain SPRITE methods were performed on a Berea core plug saturated in distilled water, on a 8.5 MHz permanent magnet. Bulk $T_1$=150 ms, $T_{2*}$=900 μs. FIGS. 7(a)-(d) are graphical representations of profiles generated from the experiments. FIG. 7(a) represents a Centric scan hybrid-SPRITE profile using a Centric hybrid-SPRITE method with DFT used according to an embodiment of the invention. The experiment time was 13 mins. FIG. 7(b) represents a hybrid-SPRITE profile using a hybrid-SPRITE method employing a gradient waveform as shown in FIG. 6 with n=3 and using DFT according to an embodiment of the invention. The experiment time was 15 mins. FIG. 7(c) represents a double half k-space ("DHK") SPRITE profile generated using a conventional DHK SPRITE method with the same parameters used as for the experiments of FIGS. 7(a) and 7(b). The experiment time was 14 mins. FIG. 7(d) represents a DHK SPRITE profile generated using a conventional DHK SPRITE method with a dwell time 8 μs. The experiment time was 14 mins. DHK SPRITE is known in the art [23]. The profile of FIG. 7(b) acquired with long TR performs better than the profile of FIG. 7(a) in terms of blurring. Sensitivity is also higher. The sensitivity of the profile of FIG. 7(b) is improved by a factor of approximately 4.5 compared to the conventional DHK results shown in FIG. 7(c). The SNR of the DHK SPRITE experiment can be improved by decreasing the filter width at the expense of more blurring because some of the high frequency components exceed the bandwidth.

Measurements were also performed on a Berea core plug saturated with brine, on an 8.5 MHz permanent magnet. The bulk $T_1$ was 200 ms, while the bulk $T_2^*$=900 μs.

Figure 16:
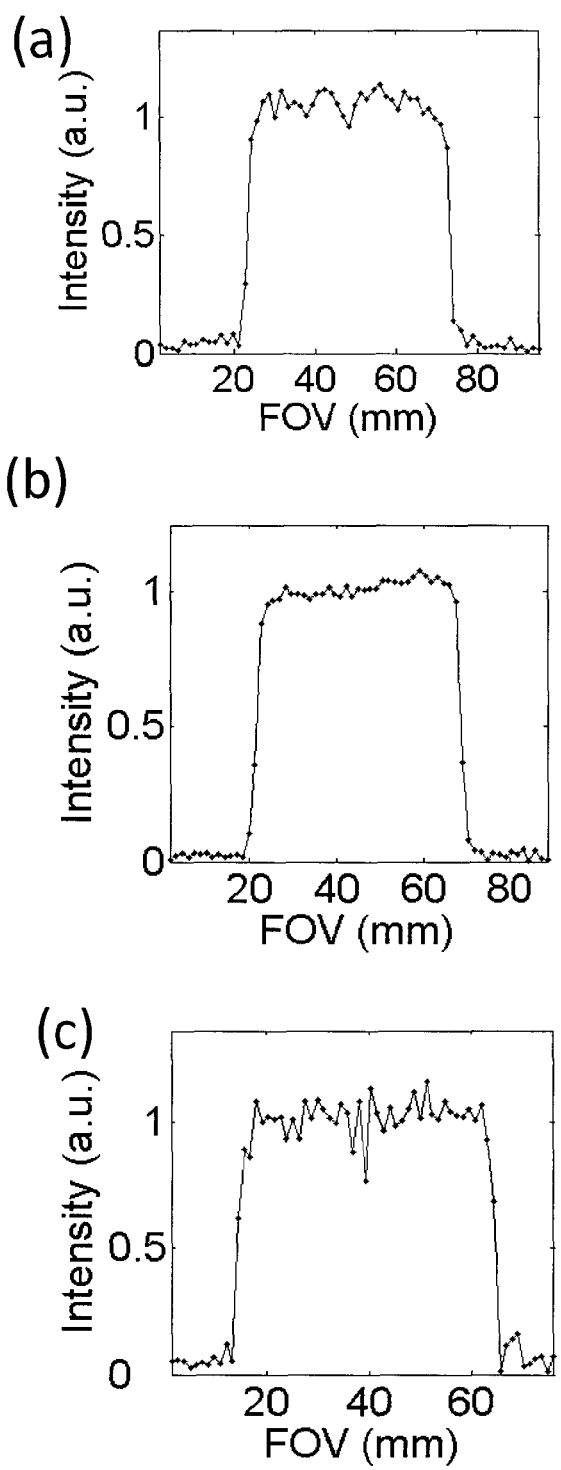
FIGS. 16(a)-(c) show 1D experiment results.

FIGS. 16(a)-(c) show experiment results of experiments conducted according to methods of certain embodiments of the present invention: FIG. 16(a) is of centric scan hybrid-SPRITE with 10 phase encoding on each side of k-space, DFT with 503 points and an experiment time of 22 mins. FIG. 16 (b) is of hybrid-SPRITE employing gradient waveform as shown in FIG. 9 with n=3, DFT with 1142 points and an experiment time of 30 mins. FIG. 16(c) is of DHK SPRITE with the same parameters and an experiment time of 36 mins. Sensitivity, defined as SNR over square root of acquisition time, is a measure of measurement efficiency. The profiles shown in FIG. 16 required similar amount of times to acquire, but the SNR and image quality are significantly different. Images of FIGS. 16(a) and 16(b) were acquired with hybrid-SPRITE with centric scan and long TR schemes according to embodiments of the present invention, (as shown in FIG. 12 and FIG. 13), respectively. 11 RF pulses were applied on each half k-space in the centric scan scheme. Considering TR=4 ms and $T_1$=200 ms, the saturated longitudinal magnetization after 11 RF pulses can be recovered within a delay time of 3×$T_1$. Also the low gradient duty cycle does not require a long delay for cooling, so the relaxation delay was shortened accordingly to reduce measurement time. The long TR scheme is advantageous in terms of blurring, as the sharp edges are preserved in FIG. 16(b). The sensitivity of FIG. 16(b) is also higher than FIG. 16(a), since much less points were employed in DFT for FIG. 16(a) as the dwell time was 5 μs. Both of the hybrid-SPRITE profiles FIG. 16(a) and FIG. 16(b) have higher SNR than DHK SPRITE in FIG. 16(c). The sensitivity of (b) is improved by approximately a factor of 5 compared to FIG. 16(c). Hybrid-SPRITE methods according to at least certain embodiments of the present invention yield good quality quantitative images even for short relaxation time systems.

1142 k-space points were employed in the DFT for FIGS. 16(b) and 503 for FIG. 16(a) as in the simulation section. There are still redundant points in k-space that were not exploited in the reconstruction.

Figure 17:
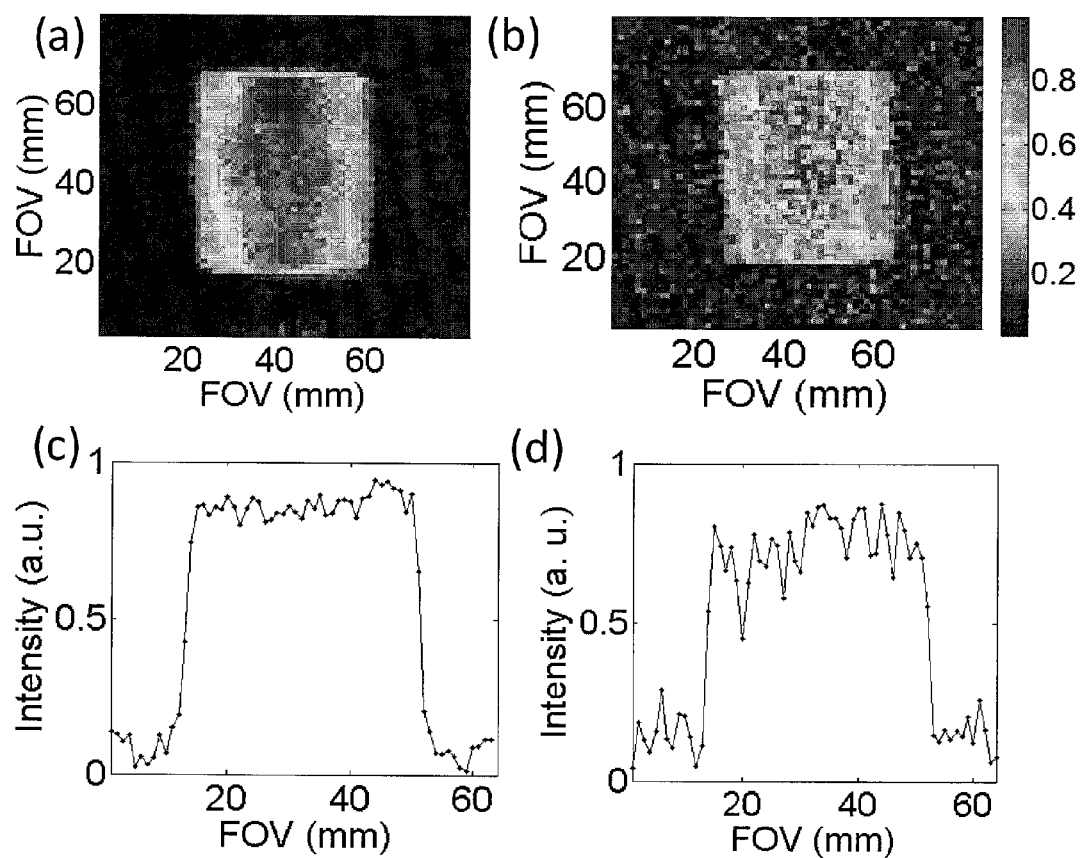
FIGS. 17(a)-(d) show experiment results.

FIGS. 17(a)-(d) show experiment results of experiments conducted according to methods of certain embodiments of the present invention: FIG. 17(a) is of 2D hybrid-SPRITE employing the same scheme as in the simulation, 127 min, and FIG. 17(b) is of 2D 4 spiral SPRITE, 164 min. The profiles of central slice are shown in FIG. 17(c) and FIG. 17(d), respectively. The hybrid-SPRITE image took 77% percent of measurement time, but has a three times higher SNR. The sensitivity is improved significantly. The gradient duty cycle is also dramatically reduced.

The sample was a Berea core plug, 5 cm long and 3.8 cm diameter, saturated with brine. The bulk $T_1$=200 ms, the bulk $T_2^*$=900 μs.

The experiments were performed on a Maran DRX-HF (Oxford Instruments Ltd, Oxford, UK) 0.2 T magnet with a vertical RF coil 10 cm in diameter and 10 cm in length. The Tomco (Tomco Technologies, Stepney, Australia) RF amplifier has a maximum output power of approximately 500 W. The gradient coils are driven by AE Techron (Elkhart, Ind.) 7788 gradient amplifiers. The experiments were performed at ambient magnet temperature.

The duration of RF pulses were 3.5 μs for a 10° flip angle in both SPRITE and hybrid-SPRITE measurements. In SPRITE, the encoding time $t_p$ was 100 μs, and maximum gradient amplitude was 9.4 Gauss/cm. In hybrid-SPRITE with 3 non-zero gradient steps, the encoding time of the phase encode points was 51 μs. The dwell time in the highest gradient steps should be 17 μs for a proper FOV, with a maximum amplitude of 2 Gauss/cm. but the dwell time was set to 1 μs in the experiment to collect as many time domain points as possible to increase SNR. The TR was 250 ms for the long TR hybrid-SPRITE measurement. In the 10 non-zero gradient steps scheme, the encoding time was 50 μs with dwell time 5 μs and maximum gradient of 6.5 Gauss/cm.

The DFT executes rapidly on modern computers. The 1D example took less than 0.1 sec to process in Matlab. The pseudo-polar grid 2D reconstruction took less than 1 s.

Methods according to the present invention may be used to image rock samples but is not limited to imaging rock samples.

Figure 18:
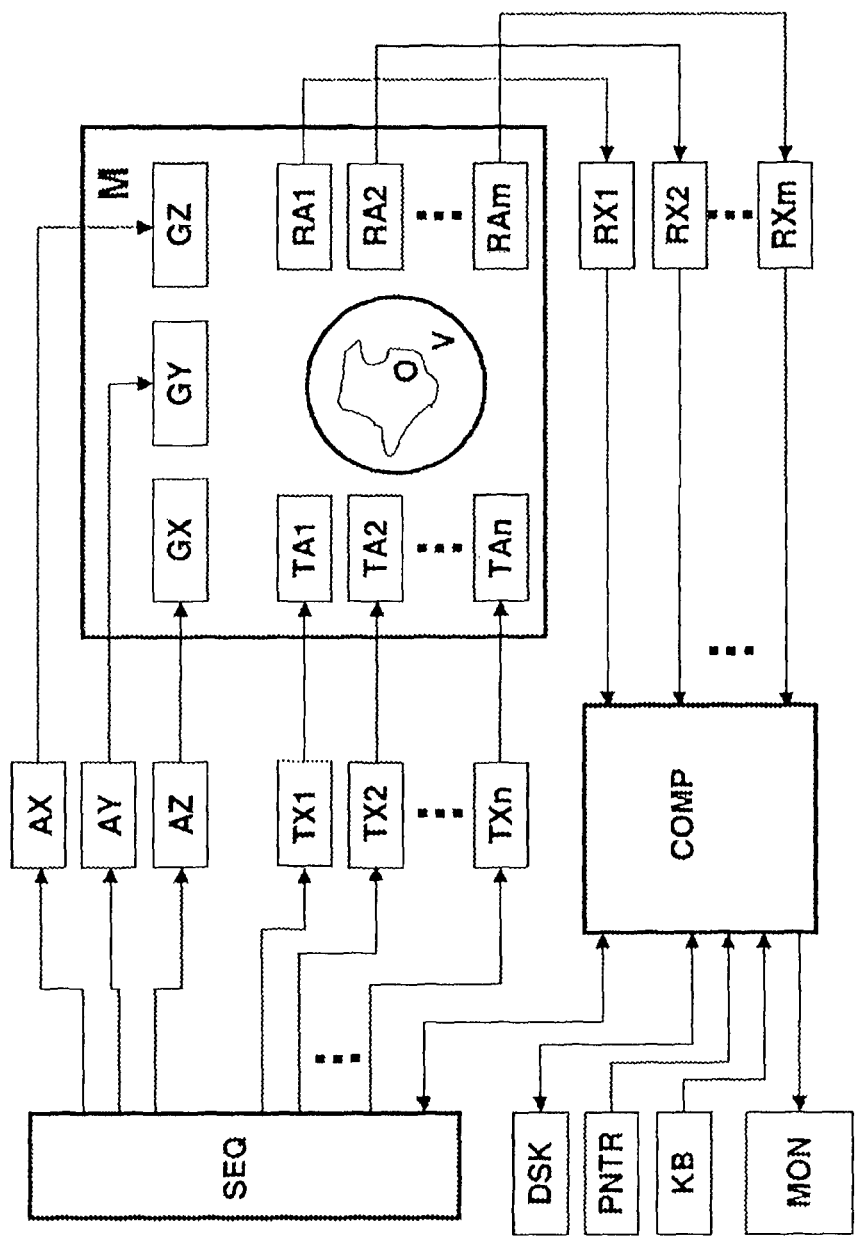
FIG. 18 shows a schematic view of an MR measuring system that is suitable for performing methods according to the present invention.

The invention may be implemented in a conventional MRI instrument as a programmed pulse sequence and may be used with an MRI instrument having low field permanent magnets. For example, FIG. 18 schematically shows an MRI measuring system which is suited for performing the inventive method. The system contains a main magnet M for generating the basic magnetic field which is substantially homogeneous and static in a volume under investigation V. Three sets of gradient coils GX, GY, and GZ are introduced into the bore of the main magnet M, which surround the volume under investigation V, and can superpose additional magnetic fields of controllable duration and strength with constant gradients on the basic field. Gradient amplifiers AX, AY, and AZ, which are driven by a sequence control unit SEQ for timely generation of gradient pulses, provide the gradient coils GX, GY, GZ with electric current for generating substantially linear gradient fields.

Several transmitting elements TA1 to TAn are located in the gradient field system, the entirety of which is also called transmitting antenna means. They surround an object under investigation O and are fed by several independent RF power transmitters TX1 . . . TXn. The RF pulses generated by these RF power transmitters TX1 . . . TXn are determined by the sequence control unit SEQ and triggered at the correct time. The transmitting elements TA1 to TAn irradiate RF pulses onto the object under investigation O located in the volume under investigation V (as described in more detail in FIG. 18), thereby exciting the nuclear spins. The resulting magnetic resonance signals are converted into electric voltage signals using one or more RF receiver elements RA1, . . . , RAm, which are then supplied to a corresponding number of receiver units RX1, . . . , RXm. The overall receiver elements RA1, . . . , RAm are also called receiver antenna means that consists of m receiver elements RA1, . . . , RAm. These are also located within the gradient coils GX, GY, GZ and surround the object under investigation O. In order to reduce the expense for equipment, the transmitting and receiver antenna means may also be designed and connected in such a fashion that one or more of the transmitting elements TA1 to TAn are also used for receiving the magnetic resonance signals. In this case, which is not considered in FIG. 18, switching over between transmitting and receiving operation is effected by one or more electronic transmitting-receiver switch points that are controlled by the sequence control unit SEQ. This means that during the RF transmitting phases of the executed RF pulse sequence, this antenna(s) is/are connected to the corresponding RF power transmitter(s) and is/are separated from the allocated receiver channels, while for the receiver phases, the transmitters are separated and the receiver channel is connected. The received signals are amplified by the receiving units RX1 to RXm shown in FIG. 18, and are converted into digital signals using conventional signal processing methods, and passed on to an electronic computer system COMP. In addition to the reconstruction of images and spectra and values derived from the received measured data, the controlling computer system COMP serves to operate the entire MRI measuring system and initiates performance of the pulse sequences through corresponding communication with the sequence control unit SEQ. The user-controlled or automatic execution of programs for adjusting the measuring system properties and/or for generating magnetic resonance images is also provided on this control computer system COMP, as well as the display of the reconstructed images, storage and management of measurement and image data and control programs. In order to perform these tasks, this computer system has at least one processor, one working memory, one computer keyboard KB, one display instrument PNTR, e.g. a computer mouse, one screen MON and one external digital storage unit DSK.

It will be understood that while the invention has been described in conjunction with specific embodiments thereof, the foregoing description and examples are intended to illustrate, but not limit the scope of the invention. Other aspects, advantages and modifications will be apparent to those skilled in the art to which the invention pertain, and those aspects and modifications are within the scope of the invention.

REFERENCES

[1] J. Jackson, A. Macovski, D. Nishimura, Low-frequency restoration, Magnetic Resonance in Medicine 11, 248-257 (1989).
[2] S. K. Plevritis, A. Macovski, Spectral extrapolation of spatially bounded images. IEEE Transaction on Medical Imaging 14, 3, 487-497 (1995).
[3] D. O. Kuethe, A. Caprihan, I. J. Lowe, D. P. Madio, H. M. Gach, Transforming NMR data despite missing points, Journal of Magnetic Resonance 139, 18-25 (1999).
[4] Y. Wu, G. Dai, J. L. Acherman, M. I. Hrovat, M. J. Glimcher, B. D. Snyder, A. Nazarian, D. A. Chesler, Water- and fat-suppressed proton projection MRI (WASPI) of rat femur bone, Magnetic Resonance in Medicine 57, 554-567 (2007).
[5] J. Rahmer, P. Bornert, J. Groen, C. Bos, Three-dimensional radial untrashort echo-time imaging with $T_2$ adapted sampling, Magnetic Resonance in Medicine 55, 1075-1082 (2006).
[6] F. Springer, G. Steidle, P. Martirosian, C. D. Claussen, F. Schick, Effects of in-pulse transverse relaxation in 3D ultrashort echo time sequences: analytical derivation, comparison to numerical simulation and experimental application at 3 T, Journal of Magnetic Resonance 206 (2010) 88-96.
[7] J. Du, M. Bydder, A. M. Takahashi, M. Carl, C. B. Chung, G. M. Bydder, Short $T_2$ contrast with three-dimensional ultrashort echo time imaging, Magnetic Resonance Imaging 29 (2011) 470-482.
[8] D. Idiyatullin, C. Corum, J. Park, M. Garwood, Fast and quiet MRI using a swept radiofrequency, Journal of Magnetic Resonance 181 (2006) 342-349.
[9] D. Idiyatullin, C. Corum, S. Moeller, M. Garwood, Gapped pulsed for frequency-swept MRI, Journal of Magnetic Resonance 193 (2008) 267-273.
[10] B. J. Balcom, R. P. MacGregor, S. D. Beyea, D. P. Green, R. L. Armstrong, T. W. Bremner, Single-point ramped imaging with $T_1$ enhancement. Journal of Magnetic Resonance Series A 123 (1996) 131-134.
[11] Z. H. Cho, Y. M. Ro, Multipoint K-Space point mapping (KPM) technique for NMR microscopy, Magnetic Resonance in Medicine 32 (1994) 258-262.
[12] M. A. Frenández-Seara, S. L. Wehrli, F. W. Wehrli, Multipoint mapping for imaging of semi-solid materials, Journal of Magnetic Resonance 160 (2003) 144-150.
[13] D. Xiao, B. Balcom, Hybrid-SPRITE MRI, In proceedings of the 11$^{th}$ International Conference on Magnetic Resonance Microscopy Joint Topic Conference on NMR in Well Logging and Core Analysis, Beijing, China, 2011, P47.
[14] A. Nauerth, Magnetic resonance imaging with combined single point and back projection data taking method, U.S. Pat. No. 5,510,710 (1996).
[15] D. M. Grodzki, P. M. Jakob, B. Heismann, Ultrashort echo time imaging using pointwise encoding time reduction with radial acquisition (PETRA), Magnetic Resonance in Medicine 67, 510-518 (2012).
[16] I. V. Mastikhin, B. J. Balcom, P. J. Prado, C. B. Kennedy, SPRITE MRI with prepared magnetization and centric k-space sampling, Journal of Magnetic Resonance 136, 159-168 (1999).
[17] M. Halse, D. J. Goodyear, B. MacMillan, P. Szomolanyi, D. Matheson, B. J. Balcom, Centric scan SPRITE magnetic resonance imaging, Journal of Magnetic Resonance 165 (2003) 219-229.
[18] J. Schoukens, J. Renneboog, Modeling the noise influence on the Fourier coefficients after a Discrete Fourier Transform, IEEE Transactions on Instrumentation and Measurement, IM-35 3 (1986) 278-286.
[19] J. I. Jackson, C. H. Meyer, D. G. Nishimura, Selection of a convolution function for Fourier inversion using gridding, IEEE Transactions on Medical Imaging, 10 3 (1991) 473-478.
[20] K. O. Johnson, J. G. Pipe, Convolution kernel design and efficient algorithm for sampling density correction, Magnetic Resonance in Medicine 61 (2009) 439-447.
[21] W. Lawton, A new polar Fourier transform for computer-aided tomography and spotlight synthetic aperture radar, IEEE Transactions on Acoustics, Speech, and Signal Processing, 36 6 (1988) 931-933.
[22] H. Han, R. P. MacGregor, B. J. Balcom, Pure phase encode magnetic field gradient monitor, Journal of Magnetic Resonance 201 (2009) 212-217.
[23] I. V. Mastikhin, H. Mullally, B. MacMillan, and B. J. Balcom, "Water content profiles with a 1D centric SPRITE acquisition". Journal of Magnetic Resonance 156 (2002) 122-130.

We claim:

1. A magnetic resonance imaging ("MRI") method for imaging an object comprising:
    generating an MRI sampling sequence comprising a pure phase encoding and a frequency encoding, the encodings being in non-orthogonal directions;
    acquiring k-space origin data by the pure phase encoding and acquiring the k-space periphery data by the frequency encoding; and, applying Fourier transform to the acquired data to generate an image of the object.

2. The method of claim 1, wherein the sampling sequence uses a centric double half k-space type gradient waveform.

3. The method of claim 1, wherein a time interval is provided during the frequency encoding and wherein the time interval is the dwell time.

4. The method of claim 1, wherein the magnetic field gradient amplitude of the sampling sequence is incremented with every excitation of the sampling sequence and the acquired data points are averaged prior to the Fourier transform step.

5. The method of claim 1, further comprising acquiring intermediate k-space data by a method selected from an encoding selected from the group consisting of a pure phase encoding and a frequency encoding.

6. The method of claim 1, where the magnetic field gradient amplitude of the sampling sequence is maintained for a plurality of excitations of the sampling sequence.

7. The method of claim 1, further comprising sampling the low frequency center portion of k-space with the pure phase encoding, and collecting time domain points for higher gradient steps to fill in the periphery of k-space.

8. The method of claim 7, further comprising using the time domain points from the low gradient steps in the generation of the image.

9. The method of claim 1, further comprising ramping gradients and collecting domain data for latter k-space steps.

10. The method of claim 9, wherein the phase encoding is repeated commensurate with the length of T2*.

11. The method of claim 1, wherein the MRI sampling sequence is a one dimensional sequence.

12. The method of claim 1, wherein the MRI sampling sequence is a two dimensional sequence.

13. The method of claim 12, further comprising using a Pseudo-polar grid for the image generation.

* * * * *